United States Patent
Treichel et al.

(10) Patent No.: US 9,458,002 B2
(45) Date of Patent: Oct. 4, 2016

(54) BOTTLE SUPPLY SYSTEM AND BOTTLE CAP ADAPTER

(71) Applicant: SUSS MicroTec Lithography GmbH, Garching (DE)

(72) Inventors: Oliver Treichel, Sternenfels (DE); Suayib Kartal, Sternenfels (DE); Kader Mekias, Sternenfels (DE); Aaron Foley, Williston, VT (US); Greg George, Williston, VT (US)

(73) Assignee: SUSS MicroTec Lithography GmbH, Garching (DE)

( * ) Notice: Subject to any disclaimer, the term of this patent is extended or adjusted under 35 U.S.C. 154(b) by 0 days.

(21) Appl. No.: 14/682,565

(22) Filed: Apr. 9, 2015

(65) Prior Publication Data

US 2015/0293453 A1    Oct. 15, 2015

(30) Foreign Application Priority Data

Apr. 11, 2014 (EP) .................................. 14164392

(51) Int. Cl.
| | | |
|---|---|---|
| *B67D 7/02* | (2010.01) | |
| *G03F 7/16* | (2006.01) | |
| *B05C 11/10* | (2006.01) | |
| *B67D 7/32* | (2010.01) | |
| *B67D 7/76* | (2010.01) | |

(52) U.S. Cl.
CPC ............. *B67D 7/0288* (2013.01); *B05C 11/10* (2013.01); *B67D 7/02* (2013.01); *B67D 7/3227* (2013.01); *B67D 7/763* (2013.01); *G03F 7/16* (2013.01)

(58) Field of Classification Search
CPC ......... G03F 7/16; B05C 11/10; B67D 3/046; B67D 7/0288
USPC .......... 141/94, 291–293; 222/185.1; 137/588
See application file for complete search history.

(56) References Cited

U.S. PATENT DOCUMENTS

| | | | |
|---|---|---|---|
| 4,120,414 A | 10/1978 | Harrison et al. | |
| 4,871,096 A | 10/1989 | Horian | |
| 8,491,275 B2 * | 7/2013 | Lolli ..................... | B29C 73/166 141/38 |

(Continued)

FOREIGN PATENT DOCUMENTS

| | | |
|---|---|---|
| EP | 0137908 A1 | 4/1985 |
| EP | 2017195 A1 | 1/2009 |
| WO | 2011154220 A1 | 12/2011 |

OTHER PUBLICATIONS

Eurpean Search Report dated Oct. 2, 2014 from EP Application No. EP14164392, 4 pages.

*Primary Examiner* — Mark A Laurenzi
*Assistant Examiner* — Timothy P Kelly
(74) *Attorney, Agent, or Firm* — Hayes Soloway, P.C.

(57) ABSTRACT

A bottle cap adapter for supplying liquids, particularly viscous liquids, comprising: a body part; and a vent tube comprising a first opening and a second opening, the first opening being configured to be put inside a bottle in the vicinity of the bottom of the bottle, wherein the body part further comprises a first surface and a second surface, the first surface being perpendicular to the vent tube and the second surface being parallel to or tilted to the first surface, e.g., by an angle of 0° to 40°, wherein the body part further comprises a channel from the first surface to the second surface, wherein at least one part of the channel comprises a connector extending to the second surface, the connector being complementary to a connector of the bottle, wherein the body part is further configured to be coupled to a bottle supply system, and wherein the vent tube is at least partially located in the channel of the body part. Also a bottle supply system for supplying liquids, particularly viscous liquids, comprising: a top part configured to house a bottle cap adapter; a bottom part comprising a reservoir configured to receive an amount of liquid from a bottle inserted in the bottle cap adapter and comprising a pressure sensor configured to measure a fluid level in the bottle; and an output connected to the reservoir.

17 Claims, 6 Drawing Sheets

(56) References Cited

U.S. PATENT DOCUMENTS 8,511,331 B2 * 8/2013 Nakashima ............... B05B 9/03
137/212
2013/0092286 A1 * 4/2013 Chou ........................ B60S 5/04
141/38
2014/0209208 A1 * 7/2014 Taniguchi ............. B29C 73/166
141/38

* cited by examiner

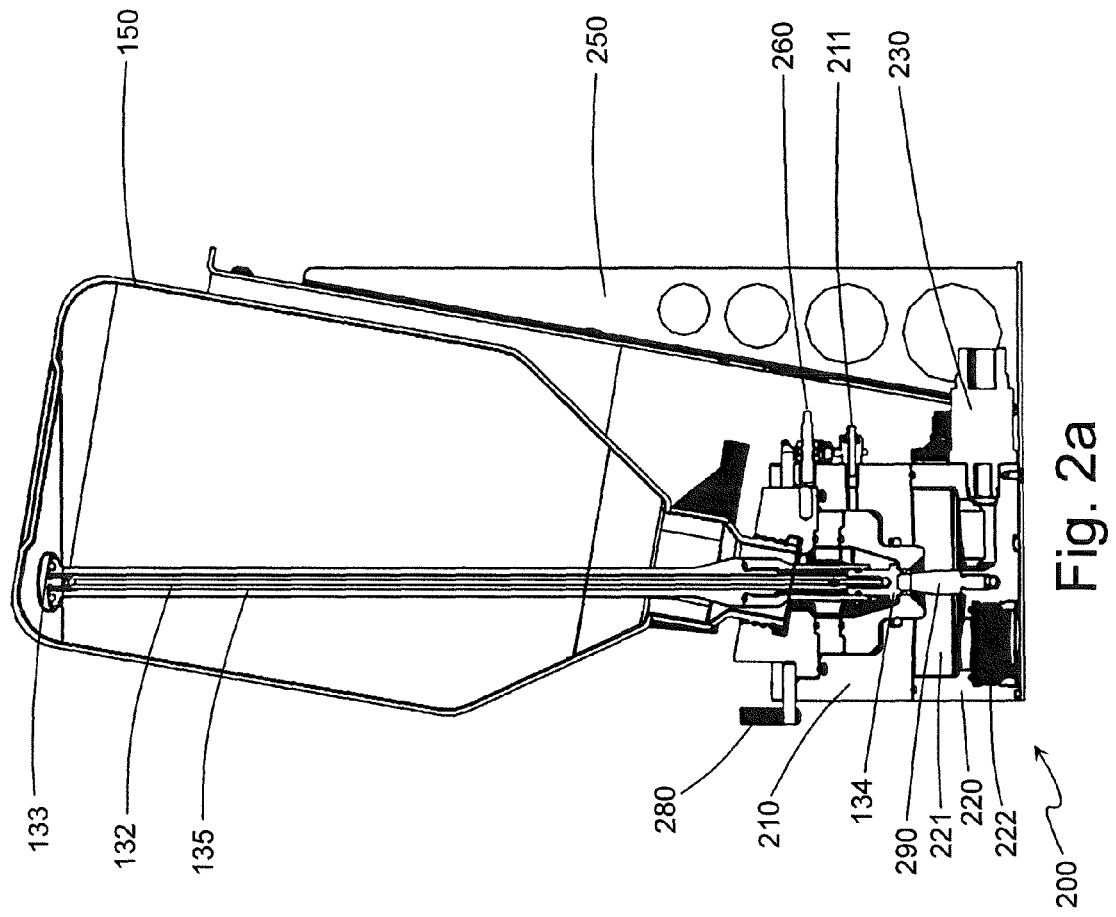

BOTTLE SUPPLY SYSTEM AND BOTTLE CAP ADAPTER

BACKGROUND

1. Field of the Disclosure

This disclosure relates to a bottle cap adapter, a bottle supply system, and a system comprising a bottle cap adapter and a bottle supply system for supplying liquids. Both, the bottle cap adaptor as well as the bottle supply system apply particularly for viscous liquids, e.g. photoresist for photolithography.

2. Discussion of the Background Art

The high cost of photochemicals, e.g., photoresist, necessitates that all material should be used in the process to the last drop. Current systems rely on a dip tube to draw the liquid out of bottles of liquids, e.g. photochemicals, which always leads to a small percentage of the liquid in the bottom being wasted.

Moreover, current systems relying on a dip tube to draw the liquid out of the bottle have problems with the exchange of the bottle: air bubbles can be trapped at the bottom of the tube which may then be transported in the process lines. The air bubble, if not purged out, will cause process defects leading to losses as well as increased production costs. A common method for avoiding such defects is to purge the bubble after each exchange of the bottle through a bubble trap which results in a further waste of the chemical that could otherwise be used for the process.

Other systems exist that may draw nearly 99% of the fluid out of the container. However, these container only fit to costly packaging systems such as the so called "NOW-PACK" offered by ATMI/NOW.

An inverted bottle system is offered by Phenix Semicron Corp. However, this system is rather bulky and may need more space in an existing tool than could be afforded in typical coater modules and/or developer modules. Furthermore, the inverted bottle system by Phenix Sem Corp. is particularly suitable for lower viscosity materials and may not function well with higher viscosity materials without modifications.

In addition, conventional systems indicate the level of the fluid remaining in the bottle by either using an empty detection system which also increases the potential for waste and bubble infusion into the process line or using a scale which provides a continuous indication of the level. However, a conventional scale system may be prone to several problems as the load being imposed by differing tubing from one setting to another.

It is a gist of the disclosure that instead of the photoresist being pumped from the bottle, the bottle is inverted, i.e. to turn the bottle upside down. With this arrangement, the photoresist is supplied by means of gravity rather than using a pump such that the generation of air bubbles during the pumping is excluded ab initio. Moreover, since the photochemical, e.g., the photoresist, at first is fed to a reservoir, there is no interruption of the supply during the bottle exchange, due to the buffer volume in the reservoir. Due to a vent tube, no additional venting of the bottle, in particular during the bottle exchange is needed.

It is an object of the disclosure to provide a bottle cap adapter for supplying liquids, a bottle supply system, and a system comprising a bottle cap adapter and a bottle supply system for supplying liquids.

SUMMARY

The disclosure relates to a bottle cap adapter for supplying liquids, particularly viscous liquids, comprising: a body part; and a vent tube comprising a first opening and a second opening, the first opening being configured to be put inside a bottle in the vicinity of the bottom of the bottle. The body part further comprises a first surface and a second surface. The first surface is perpendicular to the vent tube and the second surface is parallel to or tilted to the first surface, e.g., by an angle of 0° to 40°. In other words, in cartesian x-y-z coordinates with the vent tube being oriented in z-direction and the first surface laying in x-y plane, the second surface is parallel to or tilted to the firsts surface by an angle in either x-direction or y-direction. The body part further comprises a channel from the first surface to the second surface. At least one part of the channel comprises a connector extending to the second surface. The connector is complementary to a connector of the bottle. The body part is further configured to be coupled to a bottle supply system. The vent tube is at least partially located in the channel of the body part.

Preferably, the connector comprised in the channel is an internal thread being configured to receive an external thread of a corresponding screw-closure of the bottle. As an alternative, if the bottle has, for example, a ground glass joint, the connector can be a corresponding female ground joint.

Preferably, the liquid to be supplied can be a photoresist or any other liquid that can be used in a photolithographical process, in particular in the field of microstructuring. Preferably, the bottle cap adapter can be installed on the bottle in an upright position and can be sealed to avoid leakage during the flipping and installation operations.

Preferably, a seal is inserted at the inside end of the connector of the channel in a respective recess such that the head of the complementary connector of the bottle is sealed by the seal when connected to the connector of the body part.

According to an embodiment of the disclosure, the bottle cap adapter further comprises a vent tube head configured to seal the first opening of the vent tube during the mounting of the bottle and configured to unseal the first opening during the dispense of a liquid from the bottle to the bottle supply system.

In other words, the vent tube can be closed during installation of the bottle cap adaptor and may only be open after the flipping operation has taken place and the bottle may be placed on the base for use.

Preferably, the vent tube has a seal at the first opening or the vicinity of the first opening to support the sealing of the first opening of the vent tube by the vent tube head. Preferably, the vent tube has an extended seat area which is configured for a tight-fit seat of the vent tube head. Preferably, the vent tube head has a corresponding shape, e.g., a T-shape.

According to an embodiment of the disclosure, the bottle cap adapter further comprises a plunger being configured to seal the second opening of the vent tube during the mounting of the bottle and configured to unseal the second opening during the dispense of a liquid from the bottle to the bottle supply system, wherein the plunger is further configured to close a liquid-path in the body part during the mounting of the bottle and configured to open the liquid-path during the dispense of a liquid from the bottle to the bottle supply system.

Preferably, the liquid path is inside the channel of the body part. In other words, when the vent tube is inserted in the channel of the body part, a liquid-path can be formed between the inner wall of the channel and the outer wall of the vent tube.

Preferably, the second opening of the channel of the body part is cone-shaped. Preferably, the plunger is configured to close and open the second channel of the body part at the inner beginning of the cone shape of the second opening of the channel.

According to an embodiment of the disclosure, the vent tube further comprises a shaft being configured to connect the vent tube head and the plunger such that the vent tube head is configured to seal and unseal the first opening of the vent tube synchronously with the sealing and the unsealing of the second opening and the closing and the opening of the liquid-path respectively. In other words, both the vent tube head and the plunger can be moved at the same time, preferably in the same direction, such that the corresponding opening and closing of the first and second opening as well as the opening and closing of the is synchronized. Preferably, the synchronization of the vent tube head and the plunger can be performed by mechanical means and/or electrical means. However, it is understood by the skilled person that the synchronization can also be performed by any other suitable means.

According to an embodiment of the disclosure, the body part of the bottle cap adapter comprises an upper part, a middle part and a lower part, wherein the upper part comprises the second surface, the lower part comprises the first surface and the middle part is located between the upper part and the lower part.

According to an embodiment of the disclosure, the vent tube comprises an upper tube and a lower tube, wherein the upper tube comprises the first opening and the lower tube comprises the second opening of the vent tube. Preferably, the upper tube and the lower tube are connected, more preferably by a sealed connection assembly.

According to an embodiment of the disclosure, the body part further comprises an alignment-pin for aligning the bottle cap adapter with the bottle supply system. The pin can be used as a reference object for a respective alignment sensor in a bottle supply system in order to check whether the bottle cap is aligned properly when mounted/docked in the bottle supply system. The pin and the respective alignment sensor can preferably be based on optical, magnetical and/or electrical means.

The disclosure also relates to a bottle supply system for supplying liquids, particularly viscous liquids, comprising: a top part configured to house a bottle cap adapter, preferably a bottle cap adapter according to any of the embodiments of the disclosure; a bottom part comprising a reservoir configured to receive an amount of liquid from a bottle inserted in the bottle cap adapter and comprising a pressure sensor configured to measure a fluid level in the bottle; and an output connected to the reservoir.

Preferably, the top part and the bottom part of the bottle supply system are connected by a plug connection. Preferably, said connection comprises at least one seal. It is understood by the skilled person that the top part and the bottom part of the bottle supply system may be formed as one single part.

Preferably, the reservoir is configured such that during the changing of the bottle an amount of liquid remains at the reservoir. With this remaining amount of liquid in the reservoir, it can be avoided, among others, that any air bubble gets into the process lines. In other words, due to the remaining liquid in the reservoir, the liquid of a replacement bottle flows seamlessly to the liquid residue from the previous bottle in the reservoir. Preferably, the reservoir has a minimum capacity of 100 ml. Preferably, the reservoir is filled with a predetermined amount of liquid, e.g. 100 ml, even when a bottle is completely emptied out and has to be replaced by a replacement bottle.

According to an embodiment of the disclosure, the bottle supply system further comprises a bubble purge port connected to the reservoir and/or configured to transport bubbles occurring in the liquid from the reservoir to a purge tube.

Preferably, the open end of the purge tube is located outside the bottle supply system, more preferably above the reservoir.

According to an embodiment of the disclosure, the bottle supply system further comprises a holder being configured to hold and/or support the bottle when inserted in the bottle supply system.

Preferably, the holder is a mounting to which the bottle or at least one part of the bottle is fixed and/or on which the bottle or at least one part of the bottle rests.

According to an embodiment of the disclosure, the bottle supply system further comprises an alignment sensor configured to measure whether the bottle cap adapter is properly aligned with the bottle supply system, preferably using an or said alignment pin of the bottle cap adapter.

According to an embodiment of the disclosure, the bottle supply system further comprises a proximity sensor configured to measure whether the bottle cap adapter is approaching the bottle supply system and/or whether the bottle cap is mounted in the bottle supply system.

According to an embodiment of the disclosure, the bottle supply system further comprises a locking sensor and a slide plate, wherein the slide plate is configured to secure the bottle cap adapter to the bottle supply system and the locking sensor is configured to measure whether the bottle cap adapter is properly secured to the bottle supply system.

Preferably, the slide plate is U-shaped. Preferably, the slide plate is configured to be pushed in respective recesses of the top part of the bottle supply system and the bottle cap adapter.

According to an embodiment of the disclosure, the bottle supply system further comprises a pin located in the center of the reservoir. The pin can be configured to actuate a plunger of a vent tube of the bottle cap adapter such that an opening of the vent tube is sealed or unsealed and that a liquid-path in a body part of the bottle cap adapter is opened or closed.

Preferably, the pin can be configured to actuate a plunger of a vent tube which is connected to a shaft being connected to the vent tube head, particularly according to one of the corresponding aforementioned embodiments. Thus, the pin can preferably actuate both the plunger of the vent tube and the connected vent tube head.

According to an embodiment of the disclosure, the pressure sensor is located at the bottom side of the reservoir. The pressure sensor can be configured to measure a fluid level in the bottle by measuring the pressure given by the liquid column of the reservoir and the bottle. In other words, the filling level indication can be performed by a pressure sensor, preferably an integrated pressure sensor.

Preferably, the pressure sensor can detect the pressure given by the liquid column above, i.e. by the reservoir plus bottle. Preferably, the pressure sensor can enable a continuous level indication. Preferably, the pressure can be a function of the filling level. Preferably, a calibration of the pressure sensor can enable a linearized and precise indication of the filling level. Preferably, a software of a respective cluster control systems can define flags on some or any filling level of the bottle, more preferably with information-text on requested actions of the operator or even alarms for some or all filling levels of the bottle. In other words, the software can define flags for filling levels indicating a full bottle or partly full bottle, an approaching or immediate bottle change.

Preferably, additional sensors can be comprised in the bottle supply system configured to detect the accurate plugging of the bottle such as safety circuits or failure indication.

The disclosure also relates to a system for supplying liquids comprising a bottle cap adapter according to any of the embodiments and a bottle supply system according to any of the embodiments.

The disclosure also relates to a point interpolation method to calibrate a pressure sensor in a bottle supply system using the following steps:
(a) installing a correct bottle in a bottle cap adapter and installing the bottle cap adapter with the bottle into a bottle supply system;
(b) turning the system on;
(c) recording the sensor output of a pressure sensor when the bottle is empty;
(d) adding a predetermined amount of liquid, preferably 20 ml, to the system and recording the respective sensor output of the system;
(e) repeat step (d) until the fluid reaches a bottle flare past the bottle neck;
(f) adding a predetermined amount of liquid, preferably 100 ml, and recording the sensor output;
(g) repeating step (f) until the fluid reaches the widest part of the bottle
(h) adding a predetermined amount of liquid, preferably 500 ml, and recording the sensor output; and
(i) repeating step (h) until the liquid reaches the maximum capacity of the bottle.

According to an embodiment of the disclosure, the point interpolation method further comprises the step of calculating a function representing the respective fluid level from the recored sensor output.

According to an embodiment, the point interpolation method further comprises the step of setting a value of the function representing the fluid level to zero or to maximum when the liquid has reached the maximum capacity of the bottle. In other words, a zero level or a maximum level can be set representing the value when the liquid has reached the maximum capacity of the bottle.

According to an embodiment, the point interpolation method further comprises the step of setting a value of the function representing the fluid level to zero or to maximum when no liquid is in the bottle. In other words, a zero level or a maximum level can be set representing the value when no liquid is in the bottle.

With the present disclosure, the bottle filled with the photochemical can be connected to an adapter comprising a valve, for a safe inverting and exchange of the bottle. In case of high viscosity resists the bottle can be positioned in an upside-down position prior to insertion in order to allow an upward movement of included bubbles in the resist.

By using a sealed threaded cap adapter without a flipping mechanism as disclosed in the art, the footprint of the system, i.e. the required utility space, can be significantly reduced, e.g., by 50 percent or more.

In the present disclosure, the bottle and the cap adaptor can be totally separated from a base assembly and/or liquid lines until the bottle with the mounted cap adaptor are mated into their upside-down/inverted position.

In the present disclosure, the photoresist can flow into a reservoir and can then be pumped in the rest of the system. With this, it can be ensured that no resist/chemical liquid is left in the bottle.

The reservoir can already be included to the basement of the inverted bottle holder. There is no interrupt during the bottle exchange, given by the buffer volume in the reservoir. No additional venting may be needed during the bottle exchange.

With the present disclosure, all standard bottles used for resists can be used in the bottle cap adapter and the bottle supply system. In this context, only the bottle adapter has to be adapted to the interface of the bottle opening, e.g. the thread or any other type of closure, the size or the like.

With the present disclosure, low cost packagings such as regular glass or PE bottles can be used as supplied by the material suppliers.

With the present disclosure, the gravity feed of a liquid is facilitated with minimal resistance since the system can be open to atmosphere via a vent tube.

In the present disclosure, the system can be equipped with sensors to detect the presence and absence of the bottle in the base and the proper clamping. The sensors can be configured to inhibit operation if there is no proper installation and clamping.

With the present disclosure, the following advantages, among others, can be achieved: taking advantage of gravity feed to fill a reservoir below the bottle, taking advantage of gravity to purge bubbles that may occur during bottle exchange, having the ability to use almost 100% of the chemical in the bottle, and having the ability to sense the fill level in the bottle using a pressure transducer. With these advantages, among others, the system is cost effective since the system makes use of low cost material packaging and the system is capable of utilizing almost 100% of the fluid inside the bottle as opposed to known methods of drawing fluids.

BRIEF DESCRIPTION OF THE DRAWINGS

FIG. 2a shows a schematic diagram of a system for supplying liquids with a mounted bottle cap adapter and an inserted bottle according to an embodiment of the disclosure;

FIG. 2b shows a schematic diagram of an enlarged portion of the system shown in FIG. 2a;

DETAILED DESCRIPTION OF THE PREFERRED EMBODIMENT

Figure 1:
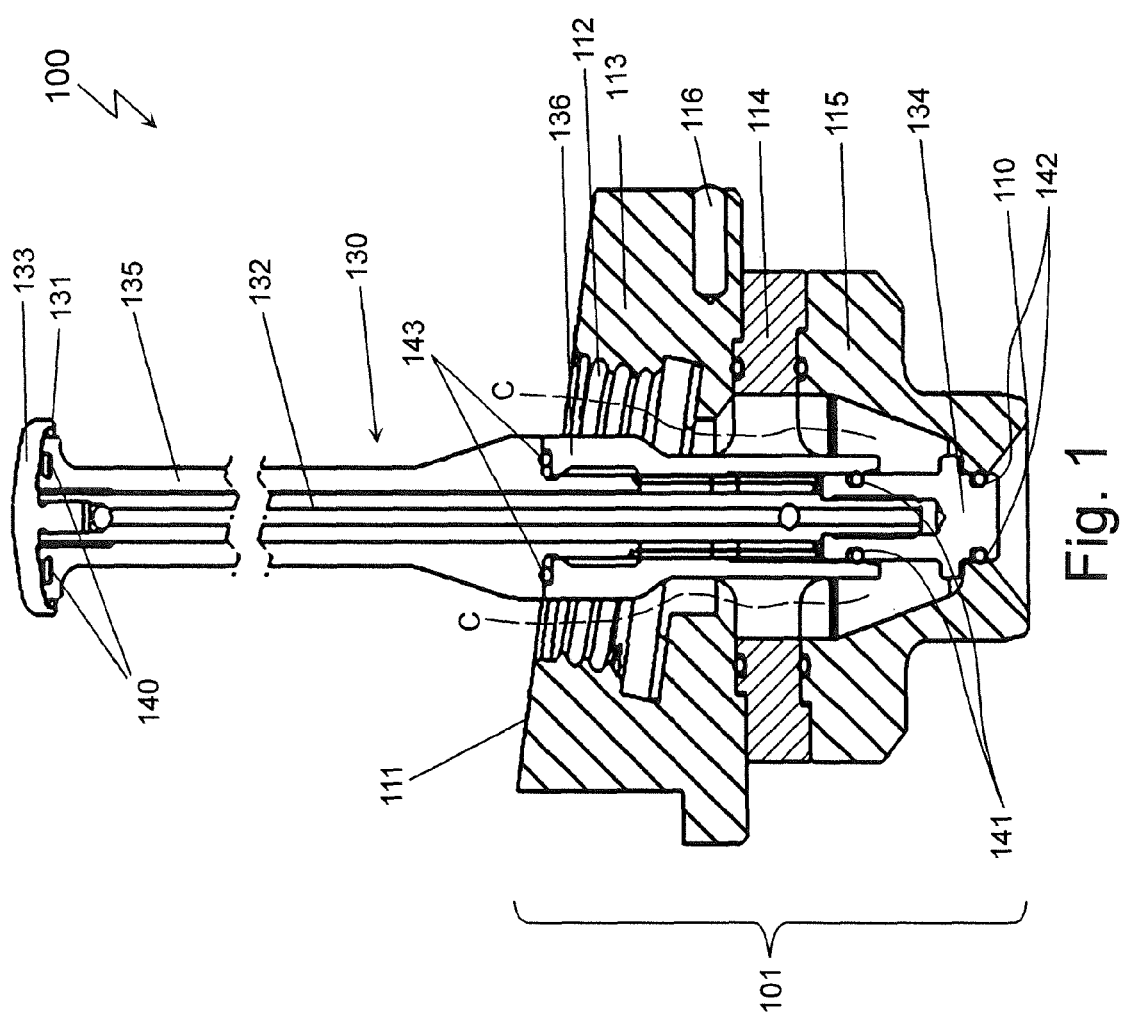
FIG. 1 shows a schematic diagram of a bottle cap adapter according to an embodiment of the disclosure.

FIG. 1 shows a schematic diagram of a bottle cap adapter 100 according to an embodiment of the disclosure. The bottle cap adapter 100 comprises a body part 101 which is separated into three sub-parts, an upper part 113, a middle part 114 and a lower part 115. All, the upper part 113, the middle part 114 and the lower part 115 comprise passages. These passages are interconnected forming one single channel C. The upper part 113 is connected with the middle part 114, and the middle part 114 is connected with the lower part 115. A seal in between the connections of each sub-part ensures that the formed channel C is sealed.

The lower part 115 comprises a first surface 110 at its lower end and the upper part 113 comprises a second surface 111 at its upper end. The first surface 110 is perpendicular to a vent tube 130 located inside the channel C which will be discussed below in more detail. The second surface 111 at the upper end of the upper part, i.e. at the upper end of the body part 101, is tilted with respect to the first surface 110, e.g., by an angle greater than 0° to 40°, or between 20° and 40°. In other words, in cartesian x-y-z coordinates with the vent tube 130 being oriented in z-direction and the surface 110 laying in x-y plane, the surface 111 is tilted by an angle in either x-direction or y-direction. With this tilting, an air bubble is formed at a respective corner of the bottle such that a vent tube head 133 is in the air bubble, i.e. out of the liquid, and the venting of the vent tube 130 can be ensured. Thus, the tilting angle can be chosen such that the air bubble is adapted to the bottle shape and/or the shape of the vent tube head 133. In other words, the tilting angle can be chosen that the air bubble is optimized and/or maximized for the shape of the bottle and/or the shape of the vent tube head 133. The vent tube head 133 will be explained in detail below.

In another embodiment (not shown), however, the second surface 111 may be parallel to first surface 110.

One part of the channel C which is formed by the passage of the upper part 113 comprises an internal thread 112 which extends at one end to the second surface 111. At the other end inside the opening of the upper part 113, a recess is formed for insertion of an O-ring (not shown). The internal thread 112 is configured to receive an external thread of a bottle, i.e. an external thread of a screw-closure of a bottle with the liquid to be supplied. In other words, the bottle can be screwed into the channel C. Additionally, the O-ring ensures a sealed connection between the bottle and the channel C.

The axis of the internal thread 112 is perpendicular to the second surface 111. The middle part 114 comprises at least one mount being configured to fix the vent tube 130 partially inside the channel C. The at least one mount is arranged so that a passage between the inner wall of the channel C and the outer wall of the vent tube is ensured. When the bottle is screwed into the internal thread 112, a liquid path is formed between the inner wall of the channel C and the outer wall of the vent tube 130 which is partially located in the center of the channel C.

The lower part 115 has a contour such that it is configured to be coupled to corresponding bottle supply system 200 (see FIG. 2a) which will be discussed in detail below.

Due to the separation of the body part 101 in the lower part 115, the middle part 114 and the upper part 113, each part can easily be replaced by another lower part, middle part and/or upper part respectively. Thus, the bottle cap adapter 100 can easily be adapted to another type of bottle, e.g. having a ground glass joint instead of a screw-closure. Hence, e.g. the internal thread 112 can be replaced easily by a connector having the corresponding counterpart of the ground glass joint. In addition, e.g. another vent tube having different dimension compared to the vent tube 130 can be installed easily.

The vent tube 130 comprises a first opening 131 at the distal end and a second opening at the proximal end. The first opening 131 can be put inside a bottle in the vicinity of the bottom of the bottle. The exact place of the first opening 131 in the bottle depends on the size and shape of the bottle. The distal end of the vent tube 130 comprising the first opening 131 is placed in the bottle such that the height of the residuing air pocket at the flipped bottom of the bottle when the bottle is mounted in the bottle cap adapter 100 upside-down under a slight angle is optimized. Therefore, for bottles having a substantially flat bottom, (and in case of a tilted second surface 111) the optimized position for the first opening 131 would be in vicinity of a side wall of the bottom of the bottle.

The bottle cap adapter 100 further comprises the vent tube head 133 which is configured to seal the first opening 131 of the vent tube 130 during the mounting of the bottle and configured to unseal the first opening 131 during the dispense of a liquid from the bottle to the bottle supply system 200. Close to the first opening the vent tube 130 has an extended seat area with a small recess and corresponding o-ring 140. The vent tube head 133 has a T-shape such that the vent tube head sits tight-fit onto the first opening 131.

The bottle cap adapter 100 further comprises a plunger 134. The plunger 134 is provided with a first seal at a first end, i.e. an O-ring 141 in this embodiment, and the outer wall at this first end of the plunger 134 fits to the inner wall of the vent tube 130. Thus the plunger 134 is configured to seal the second opening of the vent tube 130. Since the vent tube 130 should be vented during the dispense of the liquid from the bottle, the plunger 134 opens/unseals the second opening during the dispense. During the mounting of the bottle, when the vent tube 130 should be closed such that no liquid is leaking during the flipping of the bottle, the plunger 134 is closing/sealing the second opening. The plunger 134 is also provided with a second seal at a second end, i.e. an O-ring 142 in this embodiment, and the outer wall at this second end of the plunger 134 fits to a tapered part of the channel C near the lower opening of the channel C at the surface 110. Thus, the plunger 134 is configured to seal/close and open/unseal the lower opening of the channel C such that the liquid-path is closed and opened respectively.

The bottle cap adapter 100 further comprises a shaft 132. The shaft 132 is located inside the vent tube 130. The shaft connects the vent tube head 133 and the plunger 134. Due to this connection, the opening and the closing of the vent tube head 133 and the plunger 134 are performed synchronously. Thus, the vent tube head 133 closes/seals and opens/unseals the first opening 131 of the vent tube 130 synchroneously with the sealing and the unsealing of the second opening and the closing and the opening of the liquid-path respectively.

In the embodiment shown in FIG. 1, the vent tube 130 comprises an upper tube 135 and a lower tube 136, wherein the upper tube 135 and the lower tube 136 are connected and sealed at the connection with an o-ring 143. The upper tube 135 comprises the first opening 131 and the lower tube 136 comprises the second opening of the vent tube 133. With the separation of the vent tube 130 to a lower tube 135 and an upper tube 136, the upper tube 136 can easily be replaced by any other upper tube. Thus, the vent tube can be adapted to another type of bottle having different dimensions, e.g. another length compared to the bottle used previously.

The upper part 113 further comprises an alignment-pin 116 for aligning the bottle cap adapter 100 to the corresponding bottle supply system 200. The alignment will be described in more detail below.

Figure 2B:
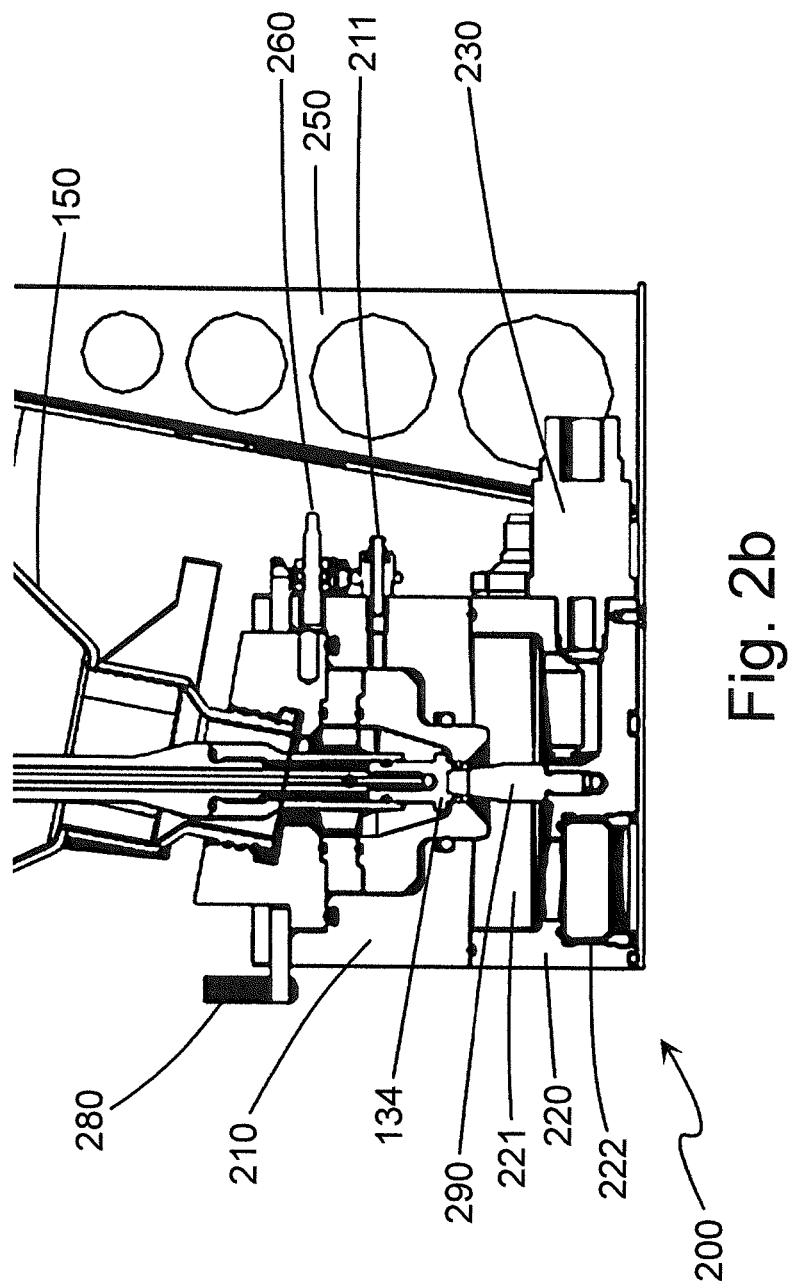

FIGS. 2a and 2b show a schematic diagram of a system for supplying liquids. Said system comprises a bottle supply system 200 with a docked/mounted bottle cap adapter 100 according to an embodiment of the disclosure and an inserted bottle 150. The bottle cap adapter 100 is mounted in the bottle supply system 200 with a bottle already properly screw in the internal thread 112 of the bottle cap adapter 100.

The bottle supply system 200 comprises a top part 210 and a bottom part 220. The top part 210 is configured to house the bottle cap adapter 100, i.e. the top part 210 comprises a cavity which has a contour substantially corresponding to the outer contour of the lower part 115 of the bottle cap adapter 100. The bottom part 220 comprises a reservoir 221 configured to receive an amount of liquid from a bottle 150 inserted in the bottle cap adapter 100. The reservoir is filled with a small amount of liquid of approx. 100 ml, even if the bottle mounted in the bottle cap adapter 100 is completely emptied and has to be replaced by another filled bottle. After a fresh bottle 150 mounted in the bottle cap adapter 100 is inserted in the bottle supply system 200, the plunger 134 and the vent tube head 133 are opened at the same time, when the lower opening of the channel C of the body part 101 is in fluid communication with the reservoir 221. Then, the liquid of the bottle 150 firstly flows to the reservoir 221 acting as a temporary storage before flowing through the output 230 and a subsequent process tube to its destination, e.g. a spin coater or a spray coater.

The bottom part 220 further comprises a pressure sensor 222 which is preferably located at a side wall or the bottom of the reservoir 221. The pressure sensor 222 is configured to measure a fluid level in the bottle 150 by measuring the pressure given by the liquid column of both the reservoir 221 and the bottle 150. A corresponding controller can convert the pressure to a respective volume using a suitable algorithm. An exemplary calibration method for the pressure sensor 222 will be explained in detail below.

The bottom part 220 further comprises an output 230 which is connected to the reservoir 221. The output 230 is connected to the process tube such that the liquid can be supplied from the bottle to its destination.

The bottle supply system 200 further comprises a pin 290 located in the center of the reservoir 221. The pin 290 actuates the plunger 134 of the bottle cap adapter 100 up and down such that the plunger 134 is opened and closed respectively. Since the plunger 134 is connected to the vent tube head 133 by a shaft 132, the pin 290 is configured to open and close both the plunger 134 and the vent tube head 133 synchroneously in the manner described above. In other words, the vent tube 130 should be vented during the dispense of the liquid from the bottle and should be closed during the bottle exchange. In addition, the channel C should be opened during the dispense of the liquid and should be closed during the bottle exchange. Thus, the pin 290 is configured to actuate the plunger 134 and the vent tube head 133 for the dispense of the liquid such that the channel C and the vent tube 130 are opened during the dispense and is configured to actuate the plunger 134 and the vent tube head 133 for the bottle exchange such that the channel C and the vent tube 130 are closed during the bottle exchange.

The bottle supply system 200 also comprises a holder 250 which holds the bottle when being mounted in the bottle supply system 200.

As already explained above, the bottle supply system 200 also comprises an alignment sensor 260. The alignment sensor 260 determines whether the corresponding alignment pin 116 of the bottle cap adapter 100 is at a predetermined position, e.g. opposite to the alignment sensor 260 when the bottle cap adapter 100 is mounted in the bottle supply system 200. The alignment sensor 260 determines whether the bottle cap adapter 100 is properly aligned with the bottle supply system 200.

In addition, the bottle supply system 200 further comprises a proximity sensor 211. The proximity sensor 211 is located in the top part 210 with the sensor head being located next to the mounting position of the lower part 115 of the bottle cap adapter 100. The proximity sensor 211 measures whether the bottle cap adapter 100 is approaching the mounting position. In addition, the proximity sensor 211 can determine whether the bottle cap adapter 100 is then mounted in the bottle supply system 200.

The bottle supply system 200 further comprises a slide plate 280 which will be explained later in detail in FIG. 4 and FIG. 5.

Figure 3:
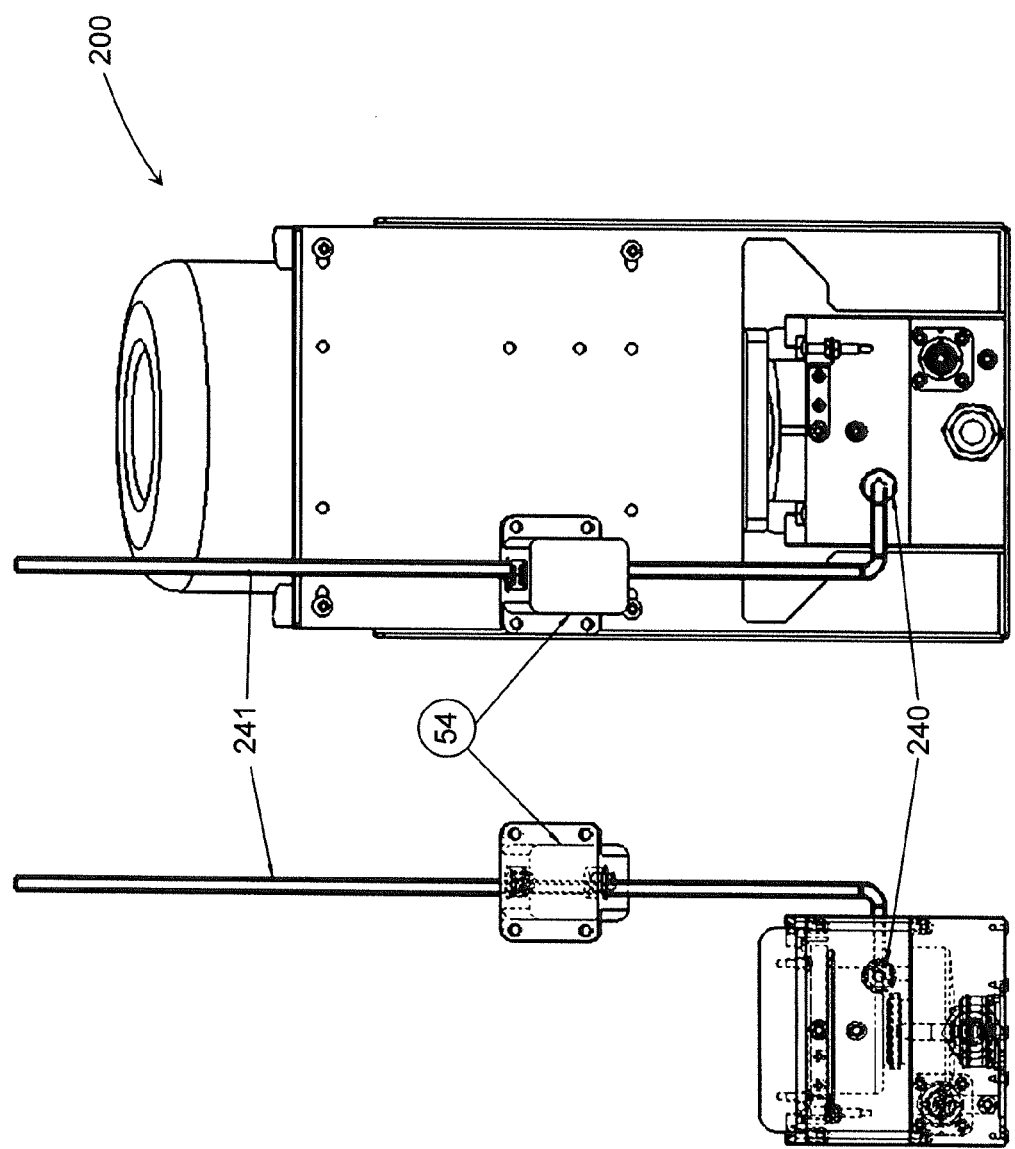
FIG. 3 shows a schematic back view diagram and a schematic side view diagram of a bottle supply system with a mounted bottle cap adapter according to another embodiment of the disclosure.

FIG. 3 shows a schematic back view diagram and a schematic side view diagram of a bottle supply system 200 with a mounted bottle cap adapter 100 according to another embodiment of the disclosure. The bottle supply system 200 further comprises a bubble purge port 240 which is connected to the reservoir 221. The bubble purge port 240 is located at an upper position of the sidewall of the reservoir 221 and consequently below the bottle level. As the liquid of the bottle flows downwardly into the reservoir 221, all possible bubbles occurring in the liquid, both inherent or trapped otherwise, are automatically transported out of the reservoir 221 by the purge port 240 to a purge tube 241. For example, when a fresh bottle 150 mounted in the bottle cap adapter 100 is inserted in the bottle supply system 200, it may happen that air bubbles are trapped at the lower opening of the channel C of the body part 101. These bubbles can be transported out of the reservoir 221 by the purge port 240 to the purge tube 241. Thus, the air bubbles cannot get into a process tube.

The dispense of the liquid to the process tube is generally an intermittent process. For example, for one spincoating process a predetermined amount of liquid has to be dispensed. Later, for another spincoating process, another or the same predetermined amount of liquid has to be dispensed. Therefore, any bubbles in the liquid have ample time to travel to the top of the reservoir, through the purge port 240 and the the purge tube 241 out of the system 200 as the liquid flows relatively slow to the output 230.

The bottle supply system further comprises a valve 54 which is mounted in the middle part of the purge tube 241 and is configured to be closed during the bottle exchange. Since some liquid may flow into the purge tube 241, this liquid would flow back to the reservoir 221 during the bottle exchange of a still partially filled bottle 150 and the liquid may overflow the reservoir 221. By closing the valve 54 before removing the partially filled bottle 150 from the bottle supply system 200 such a possible overflow can be prevented. When another bottle 150 is inserted in the bottle supply system 200 again and the liquid should flow via the output 230 to the process tube, the valve 54 is opened and the liquid left in the purge tube 241 flows back in the reservoir 221.

Figure 4:
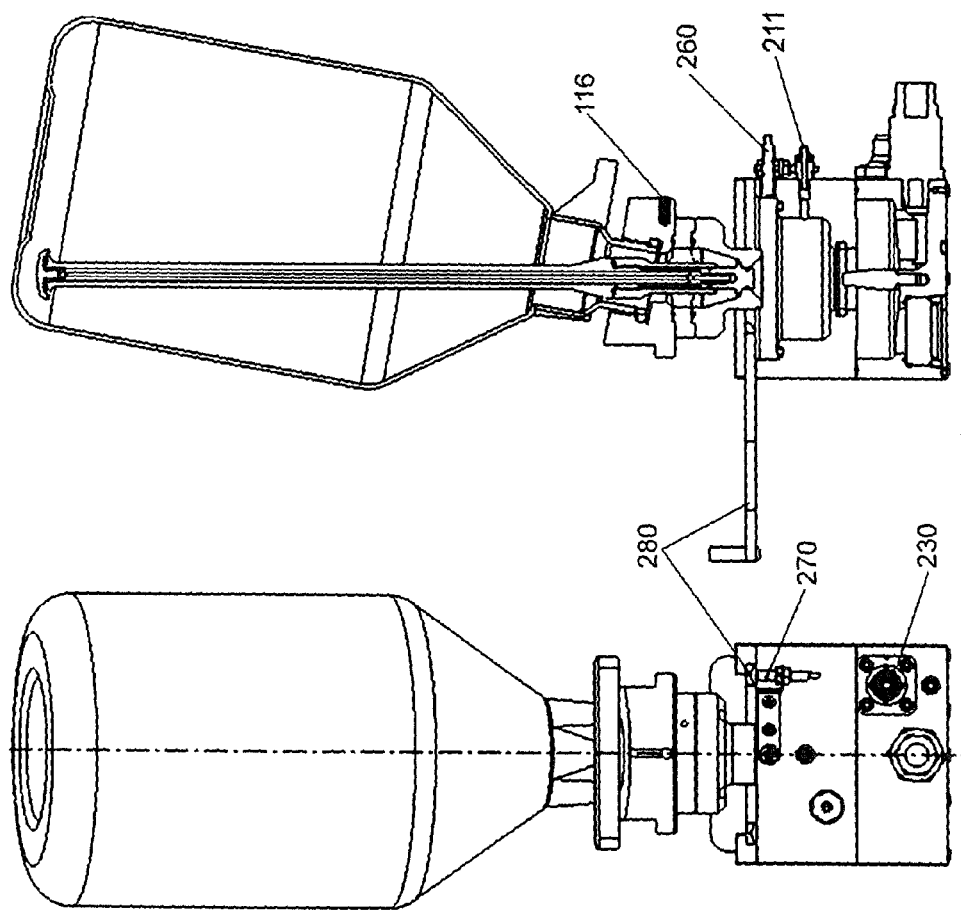
FIG. 4 shows a schematic back view diagram and a schematic side view diagram of a bottle supply system with a mounted bottle cap adapter according to another embodiment of the disclosure.

FIG. 4 shows a schematic back view diagram and a schematic side view diagram of a bottle supply system 200 with a bottle cap adapter 100 according to another embodiment of the disclosure. In this embodiment, the bottle cap adapter 100 with a mounted bottle 150 is not inserted in the bottle supply system 200 yet. Thus, the slide plate 280 is in an open position and the bottle cap adapter 100 can be inserted in the bottle supply system 200 without being blocked by the slide plate 280, In addition, the alignment pin 116 is not aligned with the alignment sensor 260 and the alignment sensor 260 does not give a corresponding signal that the bottle cap adapter 100 is aligned with the bottle supply system 200. The locking sensor 270 is configured to determine that the slide plate 280 is in the open position and not in a locking position yet. As the bottle cap adapter 100 is out of reach of the proximity sensor 211, the proximity sensor 211 does not give a corresponding signal of proximity to a respective controller (not shown).

Figure 5:
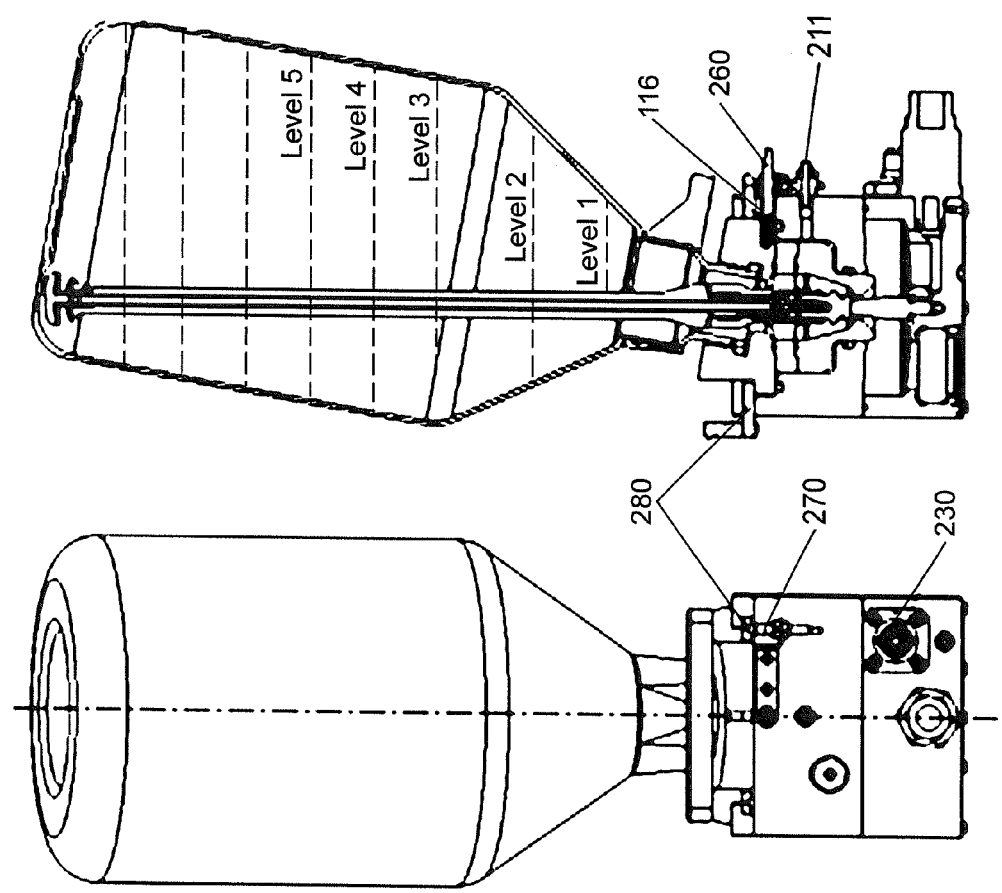
FIG. 5 shows a schematic back view diagram and a schematic side view diagram of a bottle supply system with a bottle cap adapter according to another embodiment of the disclosure.

FIG. 5 shows a schematic back view diagram and a schematic side view diagram of a bottle supply system 200 with a mounted bottle cap adapter 100 according to another embodiment of the disclosure. In this embodiment, the bottle cap adapter 100 with a mounted bottle 150 is inserted in the bottle supply system 200. Thus, the slide plate 280 is in a closed position and locks the bottle cap adapter 100 securely in the bottle supply system 200. Accordingly, the locking sensor determines that the slide plate 280 is in the closed position, In addition, the alignment pin 116 is aligned with the alignment sensor 260 and the alignment sensor 260 provides a corresponding signal that the bottle cap adapter 100 is aligned with the bottle supply system 200. Since the bottle cap adapter 100 is mounted in the bottle supply system 200, the proximity sensor 211 provides a corresponding signal to the respective controller that the bottle cap adapter 100 is in its mounting position.

The bottle shown in FIG. 5 comprises indications of different fluid levels for a calibration method of a pressure sensor according to an embodiment of the present disclosure. In step (a), a correct bottle 150 is installed in a bottle cap adapter 100 and the bottle cap adapter 100 with the bottle 150 is installed into a bottle supply system 200. In step (b), the system and corresponding one or more controllers a turned on. In step (c), the sensor output of the pressure sensor 222 is recorded when the bottle is empty. In step (d), a predetermined amount of liquid, preferably 20 ml, is added to the bottle 150 and the respective sensor output of the pressure sensor 222 is recorded. In step (e), step (d) is repeated until the fluid reaches a bottle flare past the bottle neck (level 1 in FIG. 6). In step (f), a predetermined amount of liquid, preferably 100 ml, is added to the bottle 150, and the respective sensor output of the pressure sensor 222 is recorded (level 2 in FIG. 6). In step (g), step (f) is repeated until the fluid reaches the widest part of the bottle (level 3 in FIG. 6). In step (h), a predetermined amount is added, preferably 500 ml, and the corresponding sensor output of the pressure sensor 222 is recorded. In step (i), step (h) is repeated until the liquid reaches the maximum capacity of the bottle 150.

While the disclosure has been illustrated and described in detail in the drawings and foregoing description, such illustration and description are to be considered illustrative or exemplary and non-restrictive; the disclosure is thus not limited to the disclosed embodiments. Variations to the disclosed embodiments can be understood and effected by those skilled in the art and practicing the claimed disclosure, from a study of the drawings, the disclosure, and the appended claims. In the claims, the word "comprising" does not exclude other elements or steps, and the indefinite article "a" or "an" does not exclude a plurality and may mean "at least one".

What is claimed is:

1. A bottle cap adapter for supplying liquids, comprising:
    a vent tube comprising a first opening and a second opening, the first opening being configured to be put inside a bottle in the vicinity of the bottom of the bottle;
    a body part, wherein the body part comprises:
        a first surface and a second surface, the first surface being perpendicular to the vent tube and the second surface being parallel to or tilted to the first surface; and
        a channel from the first surface to the second surface, wherein at least one part of the channel comprises a connector extending to the second surface, the connector being complementary to a connector of the bottle, wherein the body part is further configured to be coupled to a bottle supply system, and wherein the vent tube is at least partially located in the channel of the body part; and
    a plunger being configured to seal the second opening of the vent tube during mounting of the bottle and configured to unseal the second opening during dispense of a liquid from the bottle to the bottle supply system, wherein the plunger is further configured to close a liquid-path in the body part during mounting of the bottle and configured to open the liquid-path during dispense of the liquid from the bottle to the bottle supply system.

2. The bottle cap adapter of claim 1, further comprising a vent tube head configured to seal the first opening of the vent tube during mounting of the bottle and configured to unseal the first opening during dispense of the liquid from the bottle to the bottle supply system.

3. The bottle cap adapter of claim 2, wherein the vent tube further comprises a shaft being configured to connect the vent tube head and the plunger such that the vent tube head is configured to seal and unseal the first opening of the vent tube synchronously with the sealing and the unsealing of the second opening and the closing and the opening of the liquid-path respectively.

4. The bottle cap adapter of claim 1, wherein the body part comprises an upper part, a middle part and a lower part, wherein the upper part comprises the second surface, the lower part comprises the first surface and the middle part is located between the upper part and the lower part.

5. The bottle cap adapter of claim 2, wherein the vent tube comprises an upper tube and a lower tube, wherein the upper tube comprises the first opening and the lower tube comprises the second opening of the vent tube.

6. The bottle cap adapter of claim 1, wherein the body part further comprises an alignment-pin for aligning the bottle cap adapter with the bottle supply system.

7. The bottle cap adapter of claim 1, wherein the second surface is tilted to the first surface by an angle of greater than 0° to 40°.

8. A bottle supply system for supplying liquids, comprising: a top part configured to house a bottle cap adapter, said bottle cap adapter comprising: a body part; and a vent tube comprising a first opening and a second opening, the first opening being configured to be put inside the bottle in the vicinity of the bottom of the bottle, wherein the body part further comprises a first surface and a second surface, the first surface being perpendicular to the vent tube and the second surface being tilted to the first surface, wherein the body part further comprises a channel from the first surface to the second surface, wherein at least one part of the channel comprises a connector extending to the second surface, the connector being complementary to a connector of the bottle, wherein the body part is further configured to be coupled to a bottle supply system, and wherein the vent tube is at least partially located in the channel of the body part; a bottom part comprising a reservoir configured to receive an amount of liquid from a bottle inserted in the bottle cap adapter and comprising a pressure sensor configured to measure a fluid level in the bottle; and an output connected to the reservoir.

9. The bottle supply system of claim 8, further comprising a bubble purge port connected to the reservoir and configured to transport bubbles occurring in the liquid from the reservoir to a purge tube.

10. The bottle supply system of claim 9, further comprising a holder being configured to hold and/or support the bottle when inserted in the bottle supply system.

11. The bottle supply system of claim 8 further comprising an alignment sensor configured to measure whether the bottle cap adapter is properly aligned with the bottle supply system using an alignment pin of the bottle cap adapter.

12. The bottle supply system of claim 8 further comprising a locking sensor and a slide plate, wherein the slide plate is configured to secure the bottle cap adapter to the bottle supply system and the locking sensor is configured to measure whether the bottle cap adapter is properly secured to the bottle supply system.

13. The bottle supply system of claim 8 further comprising a pin located in the center of the reservoir and/or being configured to actuate a plunger of a vent tube of the bottle cap adapter such that an opening of the vent tube is sealed or unsealed and that a liquid-path in a body part of the bottle cap adapter is opened or closed.

14. The bottle supply system of claim 8, wherein the pressure sensor is located at the bottom side of the reservoir and wherein the pressure sensor is configured to measure a fluid level in the bottle by measuring the pressure given by the liquid column of the reservoir and the bottle.

15. The bottle supply system of claim 8, wherein the second surface is tilted to the first surface by an angle of greater than 0° to 40°.

16. A system for supplying liquids comprising:
a bottle cap adapter, said bottle cap adapter comprising: a body part; and a vent tube comprising a first opening and a second opening, the first opening being configured to be put inside a bottle in the vicinity of the bottom of the bottle, wherein the body part further comprises a first surface and a second surface, the first surface being perpendicular to the vent tube and the second surface being tilted to the first surface, wherein the body part further comprises a channel from the first surface to the second surface, wherein at least one part of the channel comprises a connector extending to the second surface, the connector being complementary to a connector of the bottle, wherein the body part is further configured to be coupled to a bottle supply system, and wherein the vent tube is at least partially located in the channel of the body part, and
a bottle supply system comprising: a top part configured to house said bottle cap adapter; a bottom part comprising a reservoir configured to receive an amount of liquid from the bottle inserted in the bottle cap adapter and comprising a pressure sensor configured to measure a fluid level in the bottle; and an output connected to the reservoir.

17. The system of claim 16, wherein the second surface is tilted to the first surface by an angle of greater than 0° to 40°.

* * * * *